US007288983B1

(12) United States Patent
Schwartsglass et al.

(10) Patent No.: US 7,288,983 B1
(45) Date of Patent: Oct. 30, 2007

(54) METHOD AND CIRCUIT FOR PROVIDING A TEMPERATURE DEPENDENT CURRENT SOURCE

(75) Inventors: Offer Schwartsglass, Abu Gosh (IL); Dov Yurovich, Tirat Yehuda (IL)

(73) Assignee: Broadlight Ltd., Ramat Gan (IL)

( * ) Notice: Subject to any disclaimer, the term of this patent is extended or adjusted under 35 U.S.C. 154(b) by 0 days.

(21) Appl. No.: 11/512,237

(22) Filed: Aug. 30, 2006

(51) Int. Cl.
*H01L 35/00* (2006.01)

(52) U.S. Cl. ...................................... 327/513; 327/539

(58) Field of Classification Search ..................... None
See application file for complete search history.

(56) References Cited

U.S. PATENT DOCUMENTS

| | | | | |
|---|---|---|---|---|
| 4,611,163 | A | 9/1986 | Madeley | 323/367 |
| 5,471,173 | A | 11/1995 | Moore et al. | 330/256 |
| 5,543,746 | A | 8/1996 | Kuo | 327/543 |
| 6,020,786 | A | 2/2000 | Ashby | 330/256 |
| 6,154,087 | A * | 11/2000 | Ito | 372/512 |
| 6,222,470 | B1 | 4/2001 | Schuelke | 341/119 |
| 6,583,667 | B1 * | 6/2003 | Dasgupta et al. | 330/254 |
| 6,809,557 | B2 * | 10/2004 | Gauthier et al. | 327/101 |
| 6,876,250 | B2 * | 4/2005 | Hsu et al. | 327/539 |
| 6,982,590 | B2 * | 1/2006 | Seshita | 327/539 |
| 7,075,360 | B1 | 7/2006 | Holloway et al. | 327/543 |
| 7,078,958 | B2 | 7/2006 | Gower et al. | 327/539 |
| 7,091,713 | B2 * | 8/2006 | Erdelyi et al. | 323/314 |
| 2002/0094010 | A1 | 7/2002 | Vail et al. | 374/183 |
| 2005/0195872 | A1 | 9/2005 | Moran | 372/38.07 |
| 2006/0077015 | A1 | 4/2006 | Fujita | 331/176 |

* cited by examiner

*Primary Examiner*—Cassandra Cox
(74) *Attorney, Agent, or Firm*—The North Law Group; Jerald L. Meyer; Matthew J. Moffa

(57) ABSTRACT

A programmable temperature compensation circuit having a bandgap circuit for generating a first temperature-independent voltage reference signal, $V_{REF}$ and a second temperature-dependent voltage signal, $V_{TEMP}$. A two-input buffer amplifier is coupled to the bandgap circuit for effecting impedance transformation between inputs and respective outputs thereof. A temperature dependent difference current (TDDC) is coupled to the outputs of the buffer amplifier for producing a temperature dependent current that is a function of a difference between first and second voltage signals at its inputs; and a current amplifier is coupled to the TDDC for adjusting a baseline current at room temperature and the temperature dependency slope of the temperature dependent current.

17 Claims, 7 Drawing Sheets

METHOD AND CIRCUIT FOR PROVIDING A TEMPERATURE DEPENDENT CURRENT SOURCE

FIELD OF THE INVENTION

This invention relates generally to temperature variation compensation in electrical circuits.

REFERENCES CITED

Patents and Published Applications

| | | |
|---|---|---|
| U.S. Pat. No. 4,611,163 | Madeley | September 1986 |
| U.S. Pat. No. 5,471,173 | Moore, et al. | November 1995 |
| U.S. Pat. No. 5,543,746 | Kuo | August 1996 |
| U.S. Pat. No. 6,020,786 | Ashby | February 2000 |
| U.S. Pat. No. 6,222,470 | Schuelke | April 2001 |
| U.S. Pat. No. 7,075,360 | Holloway, et al. | July 2006 |
| U.S. Pat. No. 7,078,958 | Gower, et al. | July 2006 |
| U.S. application No. 20020094010 | Kenyon, et al. | July 2002 |
| U.S. application No. 20050195872 | Moran | September 2005 |
| U.S. application No. 20060077015 | Fujita | April 2006 |

BACKGROUND OF THE INVENTION

Most electrical components implemented in integrated circuits (ICs), and in particular in analog ICs, change their electrical characteristic in response to temperature changes. That is, changes in the temperature increase the uncertainties at electrical interfaces performance that result from the current and voltage relationship that varies with respect to the temperature.

In the related art the principles of the relationship between temperature and current/voltage are well understood. However, techniques for compensating for temperature variations are not well implemented in electrical components other than transistors or diodes junctions. Components requiring better temperature compensation solutions include, for example, laser diodes, oscillators, limited amplifiers, operation amplifiers, buffers, and the likes. These components are generally integrated in ICs that are designed to operate over a wide range of temperatures, extending from −40° C. to 120° C. Temperature compensation becomes even more important in circuits requiring a high level of integration or low cost and highly reproducible implementation.

Compensating for temperature allows the stable operation of electronic components over variations in temperature and is typically achieved by means of temperature compensation circuits. One of the problems associated with such circuits is that temperature compensation circuits themselves are subject to temperature related performance changes. Furthermore, many conventional temperature compensation circuits depend on the adjustment of on-chip resistors to achieve the proper variation in the temperature coefficient of a current. These circuits are often used for circuit biasing rather than as reference current that can stabilize the operation of electric components such as those mentioned above.

It would be therefore advantageous to provide a solution that overcomes the limitations of conventional temperature compensation circuits.

SUMMARY OF THE INVENTION

The present invention provides a temperature compensation circuit implementing a temperature programmable dependency current source. One of the objectives of the disclosed circuit is compensating for temperature in analog electric components including, but not limited to, oscillators, limiter amplifiers, operational amplifiers, output buffers, laser diodes, analog-to-digital converters, sample-and-hold devices, and the likes.

Thus according to a first aspect of the invention there is provided a programmable temperature compensation circuit for providing a temperature dependent current source, said circuit comprising:

a bandgap circuit for generating a first voltage reference signal, $V_{REF}$ that is independent of temperature and a second voltage signal, $V_{TEMP}$ that is temperature-dependent;

a buffer amplifier having a pair of inputs coupled to the bandgap circuit for effecting impedance transformation between said inputs and respective outputs thereof;

a temperature dependent difference current (TDDC) coupled to the outputs of the buffer amplifier and being responsive to a first voltage signal and a second voltage signal at the respective outputs of the buffer amplifier for producing a temperature dependent current that is a function of a difference between the first voltage signal and the second voltage signal; and a current amplifier coupled to the TDDC for adjusting a baseline current at room temperature and the temperature dependency slope of the temperature dependent current.

According to a second aspect of the invention there is provided a method for providing a programmable temperature dependent current source, the method comprising:

generating a first voltage signal independent of temperature;

generating a second voltage signal dependent on temperature;

converting the first voltage signal to a first current signal;

converting the second voltage signal to a second current signal; and creating a temperature dependent current by subtracting the second current signal from the first current signal.

BRIEF DESCRIPTION OF THE DRAWINGS

In order to understand the invention and to see how it may be carried out in practice, an embodiment will now be described, by way of non-limiting example only, with reference to the accompanying drawings, in which.

DETAILED DESCRIPTION OF EMBODIMENTS

Figure 1:
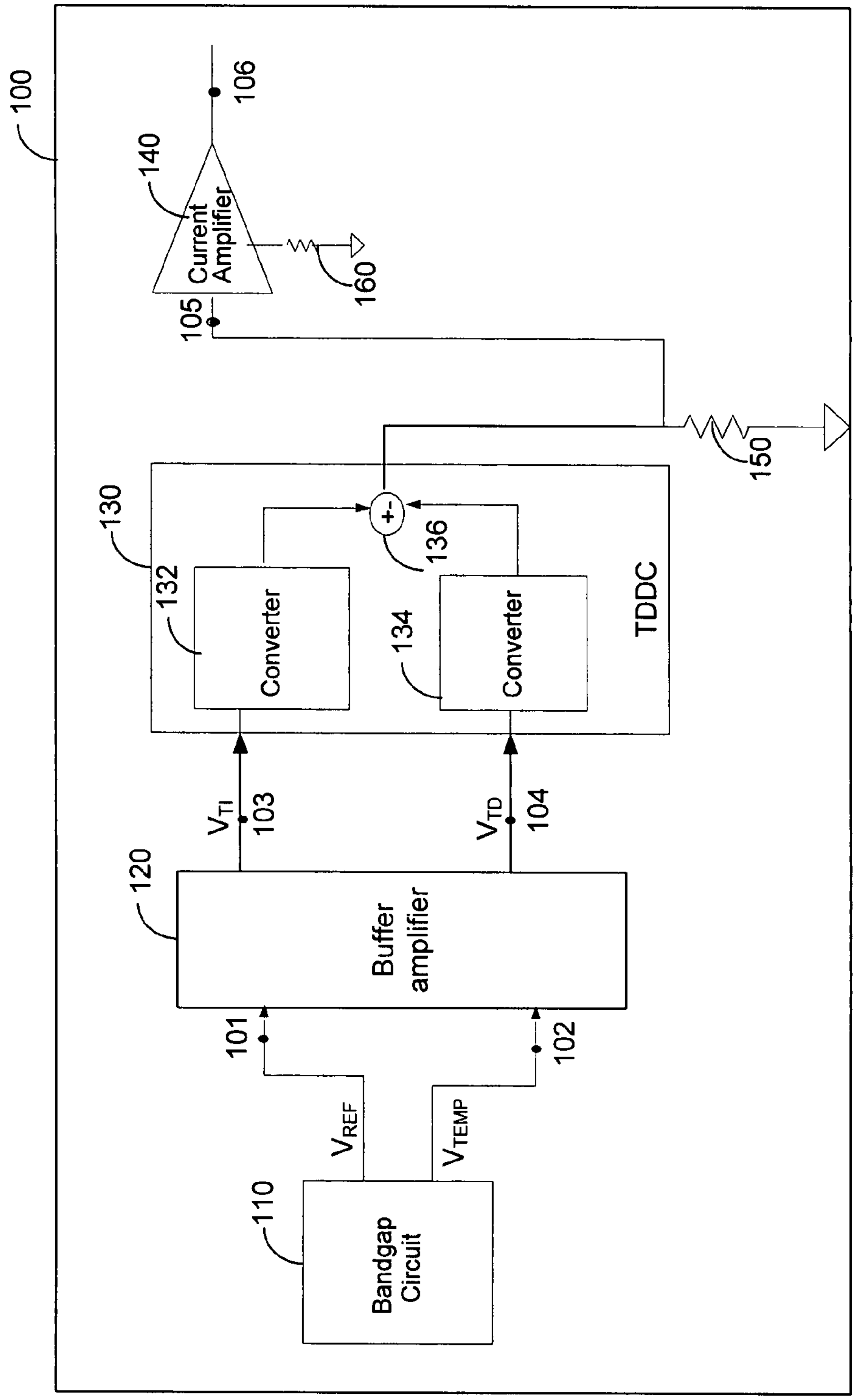
FIG. 1 is a block diagram of a temperature compensation circuit disclosed in accordance with an embodiment of the present invention.

FIG. 1 shows a block diagram of a temperature compensation circuit 100 disclosed in accordance with a non-limiting embodiment of the present invention. In order not to obfuscate the description, biasing and other accompanying circuitry are not shown. The circuit 100 includes a bandgap circuit 110, a buffer amplifier 120, a temperature dependent difference current (TDDC) 130, and a current amplifier 140. The TDDC 130 and the current amplifier 140 are commonly coupled to one terminal of a resistor 150, whose other terminal is connected to GND. The extent to which the output of the current amplifier changes with respect to a change in temperature is set by resistors 150 and 160 both of which adjust the behavior of the current amplifier 140.

Figure 2:
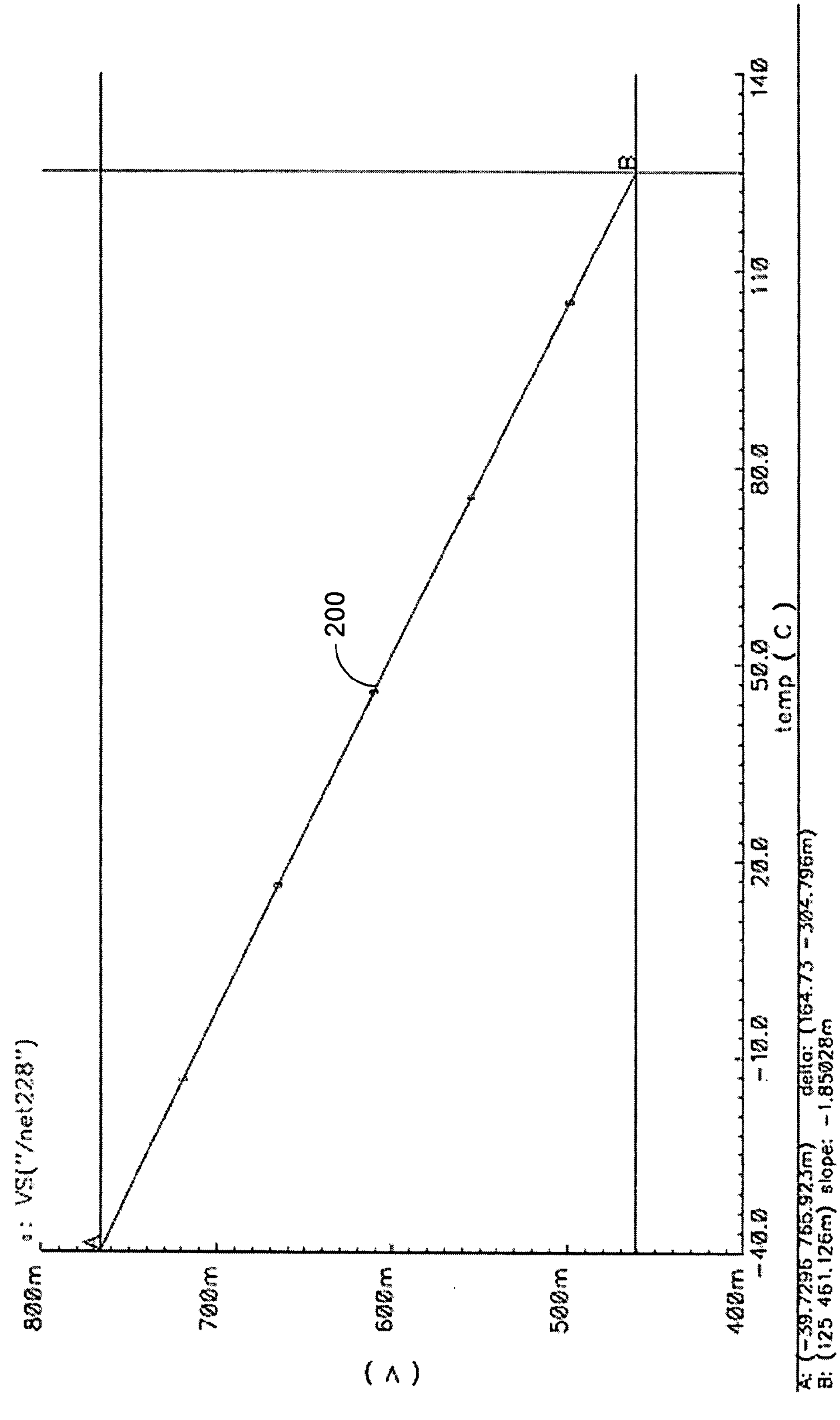
FIG. 2 is a graph showing the voltage and absolute temperature dependency.

The bandgap circuit 110 generates two voltage signals $V_{REF}$ and $V_{TEMP}$ provided at outputs 101 and 102 respectively. $V_{REF}$ is a stable voltage reference with regard to temperature, power supply and process corners. Process corners describe worst case variations in terms of temperature, voltage, pMOS speed and nMOS speed. If a design properly operates in all corners, it will probably work for any variation. Bandgap circuit 110 is typically adapted to use the temperature coefficients associated with physical properties of the semiconductor devices disposed therein to generate a nearly temperature-independent reference voltage. Bandgap circuit 110 operates on the principle of compensating the negative temperature coefficient of the base-emitter voltage ($V_{BE}$) of a bipolar transistor with the positive temperature coefficient of the thermal voltage ($V_T$). In its most basic form, the $V_{BE}$ voltage is added to a scaled $V_T$ voltage using a temperature-independent scale factor to supply the reference voltage $V_{REF}$. $V_{TEMP}$ is a voltage signal proportional to an absolute temperature but immune to variation in power supply and process corners. The bandgap circuit 110 generates the temperature-dependent voltage, $V_{TEMP}$, using a temperature sensor (not shown) having the desired temperature-voltage dependency. FIG. 2 depicts a graph 200 illustrating the dependency between voltage and absolute temperature in accordance with a non-limiting example. As shown, the voltage decreases linearly as the temperature increases.

The $V_{REF}$ and $V_{TEMP}$ signals are fed to a buffer amplifier 120 which provides impedance transformation from high to low between the bandgap circuit 110 and the TDDC 130. The buffer amplifier 120 prevents the TDDC 130 from loading the bandgap circuit 110 unacceptably and interfering with its desired operation. In circuit 100 the $V_{REF}$ and $V_{TEMP}$ signals are transferred unchanged and the buffer amplifier 120 acts as a unity gain buffer. In accordance with one embodiment of the present invention the buffer amplifier 120 includes two operational amplifiers (Op-Amps), each of which is configured to operate as an integrator and is connected to one of the input voltage signals.

The TDDC 130 receives, at input 103, a voltage signal ($V_{TI}$) independent of the temperature and at input 104 receives a voltage signal ($V_{TD}$) dependent of the temperature and generates a current signal that is proportional to the difference between the signals $V_{TI}$ and $V_{TD}$. The TDDC 130 includes voltage-to-current converters 132 and 134 which are respectively connected to the inputs 103 and 104 and are coupled to a subtractor 136. The converters 132 and 134 convert the voltage signals $V_{TI}$ and $V_{TD}$ into respective current signals $I_{TI}$ and $I_{TD}$. The subtractor 136 subtracts the current signal $I_{TD}$ from the current signal $I_{TI}$. The resulting difference current determines the work point, at room temperature, of an electrical component connected to an output 106 of the temperature compensation circuit 100. In other words, the difference current is a baseline current at room temperature of the component. The output of the subtractor 136 expresses the temperature dependency slope, $\Delta I/\Delta T$, at which the temperature dependent current (I) changes with respect to a change in the temperature (T). This is due to the fact that the subtractor 136 subtracts a constant current independent of the temperature with a current dependent on the temperature and having a negative slope. The electrical component connected to the output 106 includes, but is not limited to, oscillators, limiter amplifiers, operational amplifiers, output buffers, laser diodes, analog-to-digital converters, sample-and-hold circuits, and the likes.

Several non-limiting embodiments will be now be described to control the baseline current at room temperature and the temperature dependency slope $\Delta I/\Delta T$ of this current. In a first embodiment, the temperature dependency slope $\Delta I/\Delta T$ can be programmable by changing the resistance of the resistors 150 and 160. The resistance of each of the resistors 150 and 160 determines the value of a voltage signal ($V_{in}$) at an input 105 to the current amplifier 140. The current amplifier 140 generates an output current signal ($I_{out}$) proportional to the product of the input voltage signal ($V_{in}$) and the gain ($G_m$), i.e., $$I_{out}=G_m*V_{in} \tag{1}$$

Therefore, by changing the value of $V_{in}$, the output current signal $I_{out}$ is also changed.

In a second embodiment the temperature dependency slope $\Delta I/\Delta T$ can be programmed by controlling the gain $G_m$ of the current amplifier 140. As can be understood from equation (1), changing the gain $G_m$ results in a different value of $I_{out}$. The gain may be externally controlled by a microcontroller or a dedicated circuit. In a third embodiment, the temperature dependency slope $\Delta I/\Delta T$ can be programmed to a new value by performing asymmetrical current subtraction by means of the subtractor 136.

Figure 3A:
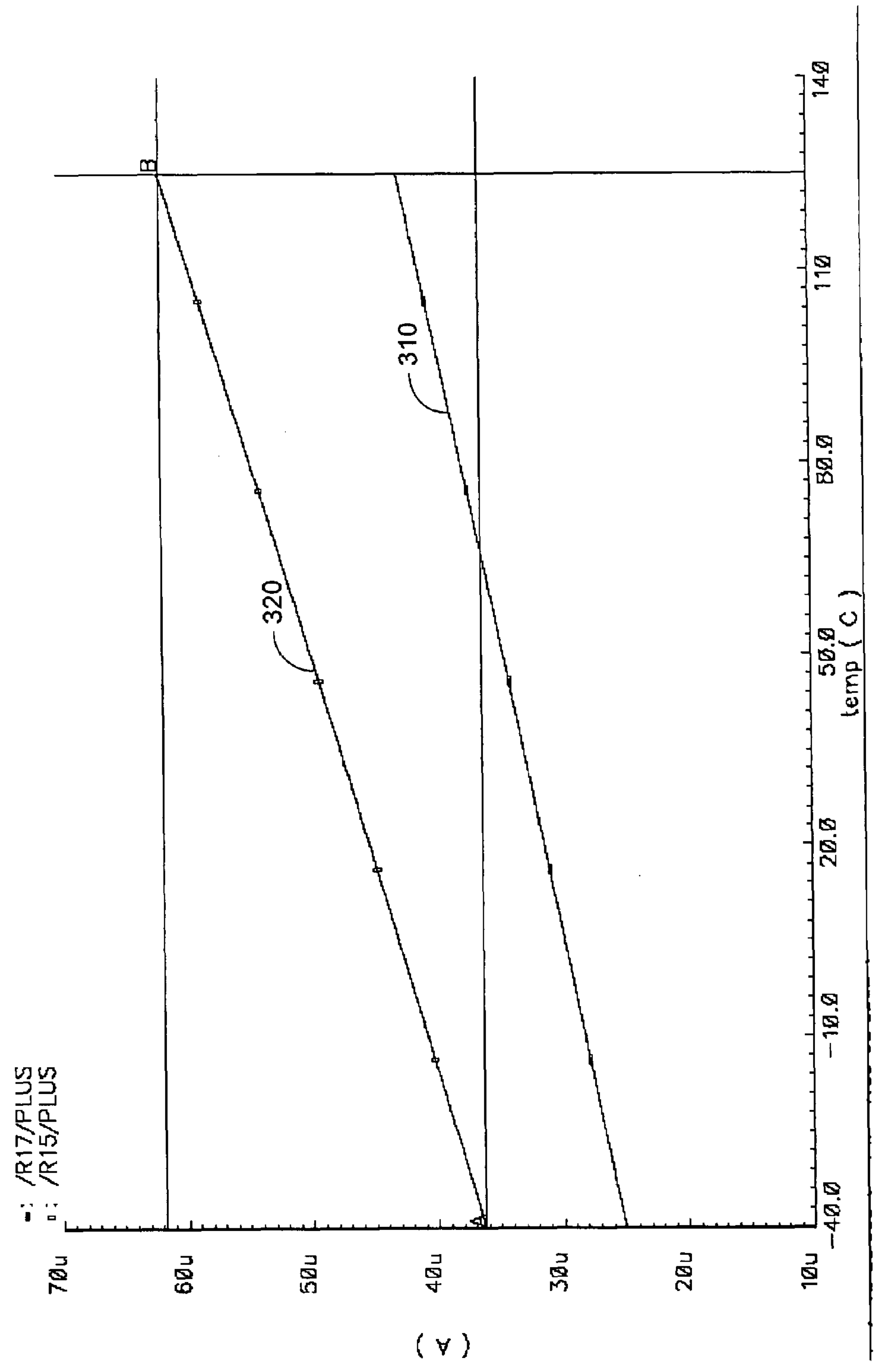
FIGS. 3*a* to 3*c* are graphs depicting the adjustment of a temperature dependency slope.

As a non-limiting example, FIG. 3*a* depicts a graph of temperature dependency slopes as produced by the circuit 100. The slope 310 is the output of the TDDC 130 having $\Delta I/\Delta T$ value of 0.01 μA/° C. The temperature dependency slope 310 can be programmable to a new value using one of the techniques mentioned above. For example, the slope 320 is the output of the current amplifier 140, and corresponds to the slope 310 after being adjusted to a corrected temperature dependency slope, $\Delta I/\Delta T$ whose value equals to 0.16 μA/° C. It should be emphasized that the temperature dependency slopes are adjusted to allow the proper operation of the electric component connected to the circuit 100 at the output 106. Thus, the temperature-corrected current fed by the current amplifier 140 to the electronic component for which temperature compensation is required. If the behavior of the electronic component is independent of changes in temperature as required, then no further adjustment is required. Otherwise, the slope $\Delta I/\Delta T$ is adjusted as explained above, until the behavior of the electronic component is independent of changes in temperature. Any required adjustment can be performed at the design stage or during operation of the IC.

Figure 3B:
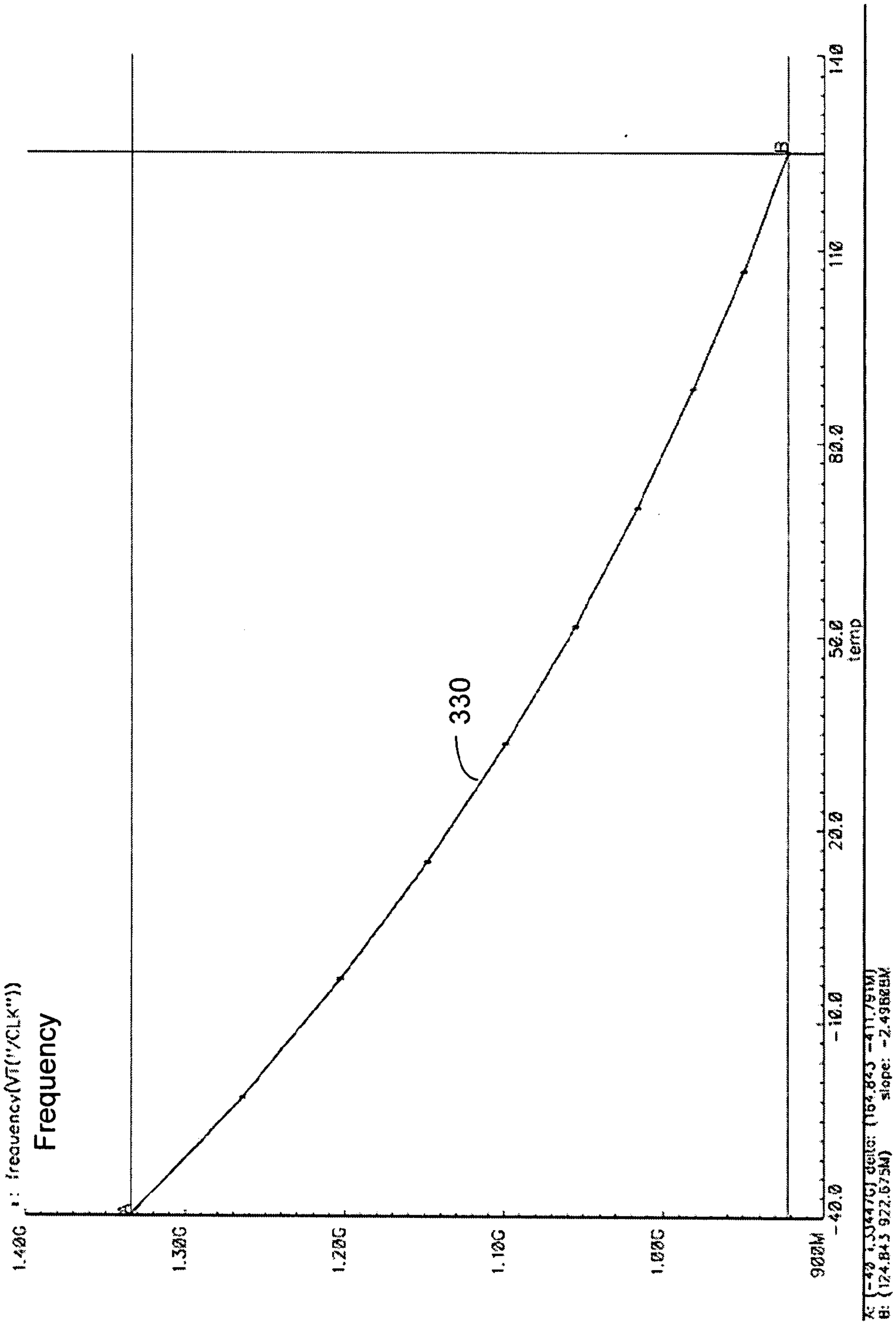
Figure 3C:
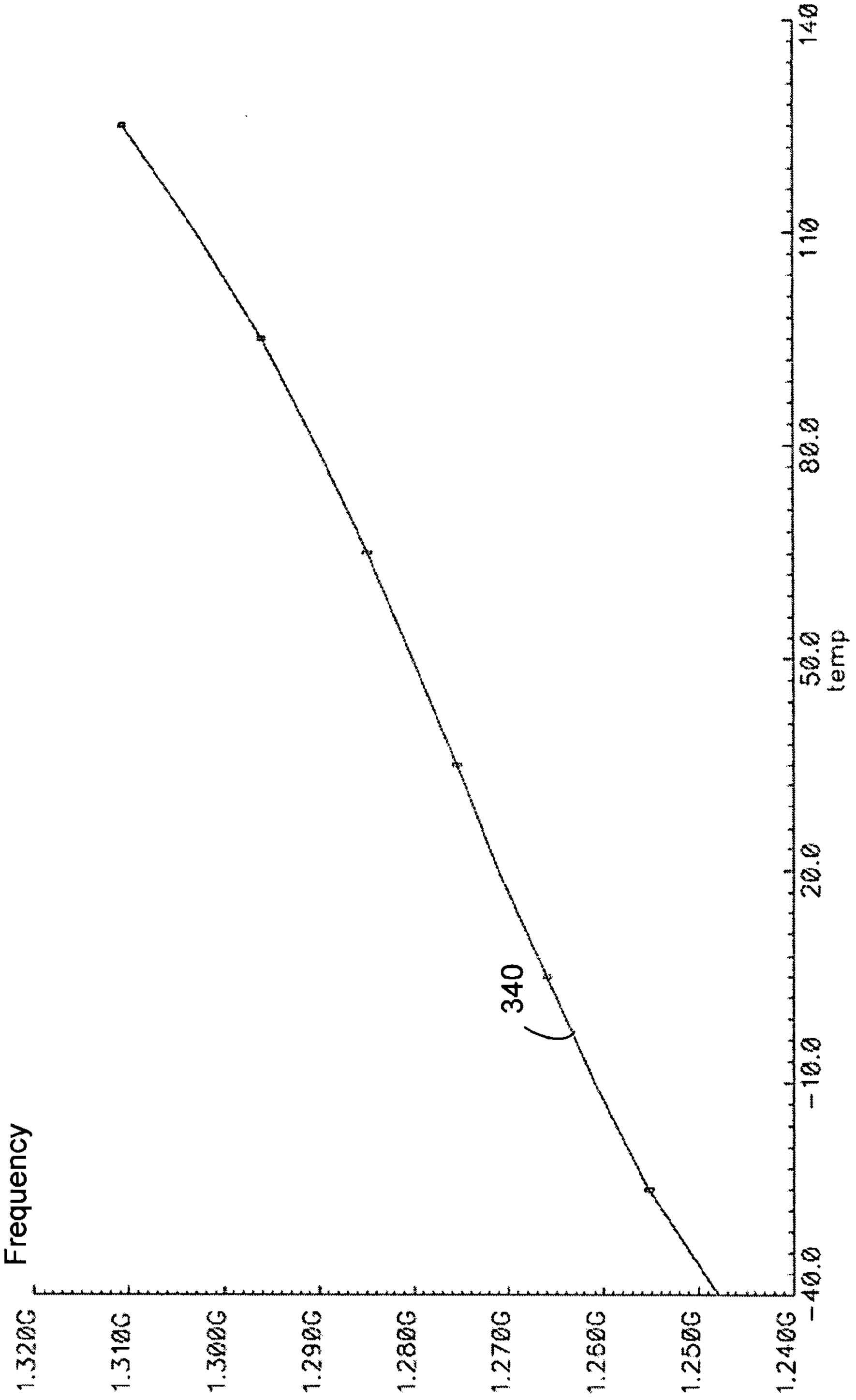

For example, FIGS. 3*b* and 3*c* depict respectively exemplary graphs of an output frequency 330 produced by an oscillator without the utilizing the disclosed circuit and an output frequency graph 340 produced by the same oscillator now connected to a compensation circuit the that embodied the techniques of the present invention. As can be noted, the rate at which the frequency changes with respect to the change in the temperature ($\Delta f/\Delta T$) in graph 340 is significantly smaller in comparison to the signal shown in graph 330 (i.e., 2.5% versus −19%).

Figure 4:
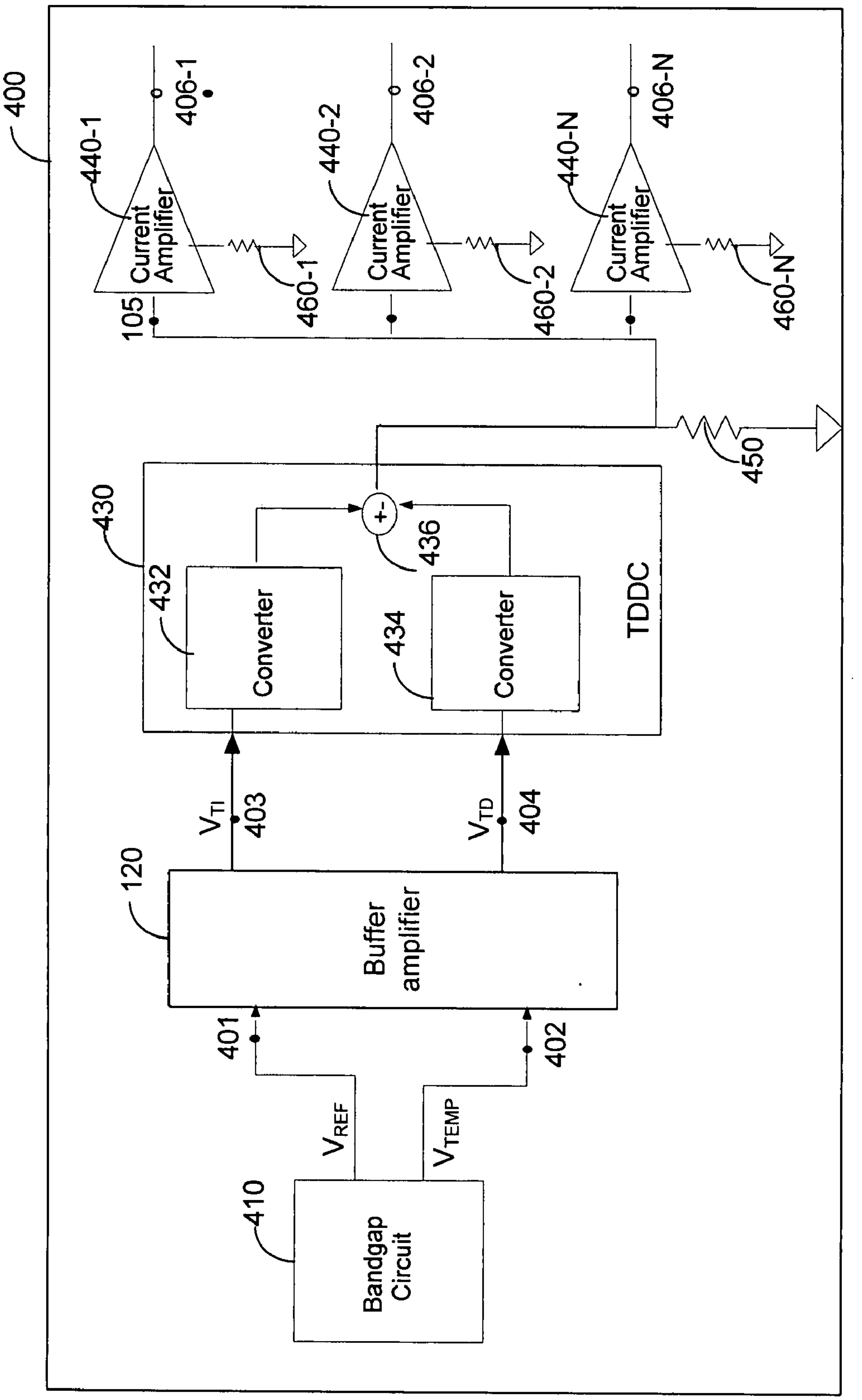
FIG. 4 is a block diagram of a temperature compensation circuit disclosed in accordance with another embodiment of the present invention.

In accordance with another embodiment of the present invention the temperature compensation circuit can be designed to produce a plurality of compensation current signals (i.e., temperature dependency slopes). As shown in FIG. 4, in such embodiment a temperature compensation circuit 400 includes a plurality of current amplifiers 440-1 through 440-N each of which is coupled to a different type of electrical component. For example, current amplifiers 440-1, 440-2 and 440-N may be respectively connected to an oscillator, a limiter amplifier and a laser diode. Each current amplifier 440 is coupled to an output 406 of a TDDC 430. In accordance with another embodiment (not shown), the plurality of compensation current signals are generated by a plurality of TDDC 430 each of which is coupled to a respective current amplifier 440.

In accordance with one embodiment of the present invention the temperature compensation circuits disclosed herein are implemented using a mixed signal CMOS process. In accordance with another embodiment of the present invention, the temperature compensation circuits can be integrated in an optical line terminal (OLT) or an optical network unit (ONU) of a passive optical network (PON).

Figure 5:
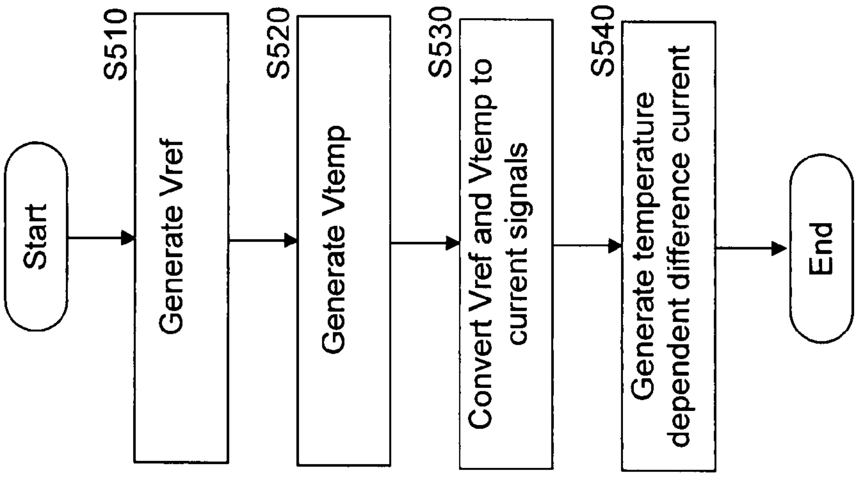
FIG. 5 is a flowchart describing the process for producing a temperature dependent current source in accordance with an embodiment of the present invention.

FIG. 5 shows a non-limiting flowchart 500 describing a process for producing a current source for temperature compensation in accordance with an embodiment of the present invention. At S510, the process generates a first reference voltage signal ($V_{REF}$) which is independent of temperature, process-corners and power supply. At S520 the process generates a second reference voltage signal ($V_{TEMP}$) which depends on the absolute temperature, but not on process-corners and power supply. At S530, the first and second reference voltage signals are converted to respective current signals $I_{TI}$ and $I_{TD}$. At S540, a temperature dependent difference current is created by subtracting the current signal $I_{TD}$ from the signal $I_{TI}$. The temperature dependency slope of the difference current can be adjusted as discussed in greater detail above.

The invention claimed is:

1. A programmable temperature compensation circuit for providing a temperature dependent current source, said circuit comprising:

a bandgap circuit for generating a first voltage reference signal, $V_{REF}$ that is independent of temperature and a second voltage signal, $V_{TEMP}$ that is temperature-dependent;

a buffer amplifier having a pair of inputs coupled to the bandgap circuit for effecting impedance transformation between said inputs and respective outputs thereof;

a temperature dependent difference current (TDDC) coupled to the outputs of the buffer amplifier and being responsive to a first voltage signal and a second voltage signal at the respective outputs of the buffer amplifier for producing a temperature dependent current that is a function of a difference between the first voltage signal and the second voltage signal; and a current amplifier coupled to the TDDC for adjusting a baseline current at room temperature and the temperature dependency slope of the temperature dependent current.

2. The circuit of claim 1, wherein said TDDC and said current amplifier are commonly coupled to a first terminal of a first resistor, having a second terminal connected to ground, GND.

3. The circuit of claim 2, wherein said current amplifier is further coupled to a first terminal of a second resistor, having a second terminal connected to ground, GND.

4. The circuit of claim 3, wherein said first voltage signal is independent of temperature, power supply and process corners.

5. The circuit of claim 4, wherein said second voltage signal is dependent on temperature and independent of power supply and process corners.

6. The circuit of claim 5, wherein said TDDC comprises:

a first voltage-to-current converter for converting the first voltage signal to a first current signal;

a second voltage-to-current converter for converting the second voltage signal to a second current signal; and a subtractor for subtracting the second current signal from the first current signal and thereby producing the temperature dependent current.

7. The circuit of claim 6, further including means for changing a dependency between said temperature dependent current and a change in temperature.

8. The circuit of claim 3, including means for changing a gain of said current amplifier so as to adjust the temperature dependency slope of the temperature dependent current.

9. The circuit of claim 1, wherein said temperature dependent current source is supplied to at least an analog electrical component.

10. The circuit of claim 9, wherein said analog electrical component comprises at least one of: an oscillator, a limiter amplifier, an operational amplifier, a buffer amplifier, a laser diode, an analog-to-digital converter, a sample-and-hold circuit.

11. A method for providing a programmable temperature dependent current source, the method comprising:

generating a first voltage signal independent of temperature, process-corners and power supply;

generating a second voltage signal dependent on temperature, process-corners and power supply;

converting the first voltage signal to a first current signal;

converting the second voltage signal to a second current signal; and creating a temperature dependent current having a programmable temperature dependency slope by subtracting the second current signal from the first current signal.

12. The method of claim 11, further including supplying said temperature dependent current source to at least an analog electrical component.

13. The method of claim 12, wherein said analog electrical component comprises at least one of: an oscillator, a limiter amplifier, an operational amplifier, a buffer amplifier, a laser diode.

14. The method of claim 11, further including amplifying the temperature dependent current using a current amplifier.

15. A method for providing a programmable temperature dependent current source, the method comprising:

generating a first voltage signal independent of temperature;

generating a second voltage signal dependent on temperature;

converting the first voltage signal to a first current signal;

converting the second voltage signal to a second current signal;

creating a temperature dependent current by subtracting the second current signal from the first current signal; and amplifying the temperature dependent current using a current amplifier.

16. The method of claim 15, including adjusting the temperature dependency slope of the temperature dependent current by changing an external resistance value of an external resistor coupled to the current amplifier.

17. The method of claim 15, including adjusting the temperature dependency slope of the temperature dependent current by changing a gain of said current amplifier.

* * * * *